(12) United States Patent
Maciver

(10) Patent No.: US 7,743,996 B2
(45) Date of Patent: Jun. 29, 2010

(54) SYSTEM AND METHOD FOR DATA ENTRY

(75) Inventor: Mark A. Maciver, Bridge of Weir (GB)

(73) Assignee: International Business Machines Corporation, Armonk, NY (US)

( * ) Notice: Subject to any disclaimer, the term of this patent is extended or adjusted under 35 U.S.C. 154(b) by 927 days.

(21) Appl. No.: 11/176,530

(22) Filed: Jul. 7, 2005

(65) Prior Publication Data

US 2006/0107178 A1    May 18, 2006

(30) Foreign Application Priority Data

Oct. 7, 2004    (GB) ................... 0422295.6

(51) Int. Cl.
*G06K 7/10* (2006.01)
(52) U.S. Cl. .............. 235/472.01; 235/472.02; 235/472.03
(58) Field of Classification Search .......... 235/472.01, 235/472.02, 472.03, 82 R; 455/456.1, 67.11, 455/67.13
See application file for complete search history.

(56) References Cited

U.S. PATENT DOCUMENTS

| 3,593,311 | A | 7/1971 | Caldwell |
| 6,748,568 | B2 | 6/2004 | Blaum et al. |
| 2002/0067308 | A1* | 6/2002 | Robertson ............. 342/357.17 |
| 2004/0203461 | A1* | 10/2004 | Hay ..................... 455/67.13 |

* cited by examiner

*Primary Examiner*—Karl D. Frech
(74) *Attorney, Agent, or Firm*—Cantor Colburn LLP; Ronald Kaschak

(57) ABSTRACT

A system and method for data entry by an operator uses data containing a first component and a second component derived therefrom, wherein the second component has error detection and correction abilities therein. The second component of the entered data is used to detect and correct error in the data entered for the first component. The first and second components are preferably characters (e.g., representing GPS position information) entered via a data entry device, while the second component preferably comprises Hamming code. The detection and correction can be performed after data entry and again after signal transmission.

17 Claims, 2 Drawing Sheets

SYSTEM AND METHOD FOR DATA ENTRY

CROSS-REFERENCE TO RELATED APPLICATIONS

This application claims priority from Patent Application No. GB0422295.6 filed on Oct. 7, 2004 and entitled SYSTEM AND METHOD FOR DATA ENTRY.

FIELD OF THE INVENTION

This invention relates generally to the field of the entry of data into a data processing system, and more particularly to a system and method for reducing the likelihood of operator entry error.

BACKGROUND OF THE INVENTION

Many systems such as Global Positioning System (GPS) rely on the entry of multiple coordinates using keypads. In a GPS system, if one digit is mistyped then the navigation system might contain a positional error in the order of hundreds of kilometers. Equally, a navigational error in the order of meters can be dangerous and difficult to spot detect. Navigational errors are more likely in adverse climatic or acoustic conditions and many other situations where accuracy is often critical.

U.S. Pat. No. 3,593,311 discloses a data recorder with single operator entry-verify control, in which each character entered is compared with the character it is replacing and an error control bit is produced for an unequal comparison, requiring verification of any data entered during a verify cycle.

U.S. Pat. No. 6,748,568 discloses an apparatus and method for verifying proper data entry and detecting common typing errors, in which common keyboard typing errors are detected by using at least one parity bit. When error is detected, the data input operator can be warned or entry may be automatically suspended.

These approaches have the disadvantage that although errors in operator data entry may be detected, the result of such detection is only to require operator verification of the entry or to automatically suspend entry. A need therefore exists for a system and method for data entry wherein the abovementioned disadvantage is alleviated.

SUMMARY OF THE INVENTION

Briefly stated, a system and method for data entry by an operator uses data containing a first component and a second component derived therefrom, wherein the second component has error detection and correction abilities therein. The second component of the entered data is used to detect and correct error in the data entered for the first component. The first and second components are preferably characters (e.g., representing GPS position information) entered via a data entry device, while the second component preferably comprises Hamming code. The detection and correction can be performed after data entry and again after signal transmission.

According to an embodiment of the invention, a system for data entry includes means for operator entry of data containing a first component and a second component derived from the first component, wherein the second component includes error detection and correction abilities for the first component therefore; and means for receiving the entered data, deriving therefrom the second component, and using the second component to detect and correct error in the data received for the first component.

According to an embodiment of the invention, a method for data entry includes the steps of entering, by an operator using a data entry device, of data containing a first component and a second component derived therefrom, wherein the second component has error detection and correction abilities therein; and deriving from the entered data the second component and using the second component to detect and correct error in the data entered for the first component.

According to an embodiment of the invention, a program storage device readable by a machine, tangibly embodies a program of instructions executable by the machine to perform a method for verifying proper data entry into the machine using a data entry device, wherein the method includes the steps of receiving data containing a first component and a second component derived therefrom, wherein the second component has error detection and correction abilities contained therein; and determining from the received data the first component and the second component and using the second component to detect and correct error in the first component.

DETAILED DESCRIPTION OF THE PREFERRED EMBODIMENT

Figure 1:
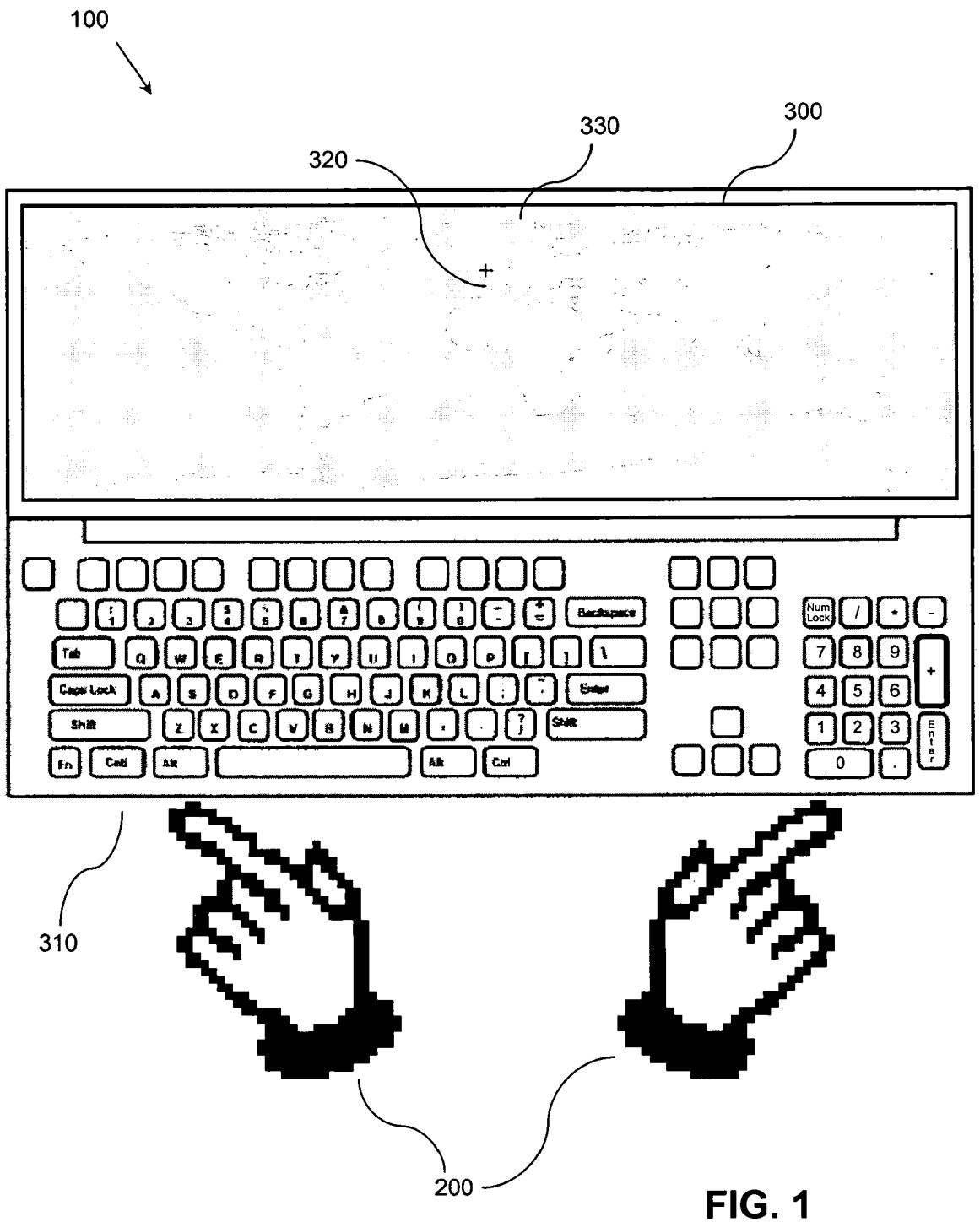
FIG. 1 shows a schematic diagram illustrating operator entry of GPS coordinates to a satellite navigation system.

Referring firstly to FIG. 1, in a computer-based GPS navigation system 100 an operator (shown only by hands 200) enters GPS position data into a computer (e.g., a portable laptop personal computer) 300 via the computer's keyboard 310. The computer 300 runs GPS navigation software (as is well-known and need not be described herein in further detail), and the entered geographic position 320 is displayed on the computer's display screen 330. The operator might receive the GPS coordinate data from a variety of sources such as pre-coded information on printed maps, through audio instruction across radio communications, etc.

As will be explained in greater detail below, the operator may enter the GPS position data in an encoded form with one or more additional characters (e.g., numbers), and these additional characters can be used by the computer (by software—not shown—running on a processor—also not shown—within the computer) to detect error(s) in the key presses used to enter the data and to automatically correct the error(s).

Methods exist in signal transmission to incorporate error detection and correction digits (parity bits) onto a digital sequence. This can be used to reconstruct the original message in the presence of electrical noise or to raise an error flag in the presence of excessive noise. Normal language has a certain amount of built-in redundancy that usually allows a message to be reconstructed in the presence of some noise. The entry of a string of characters into a keypad for a system such as the GPS navigation system has heretofore not contained redundant information. Adding a number of characters to the key sequence can provide robust error detection and correction without either major technological change or significant process change. The entire operation can be performed in software.

EXAMPLE

Using numbers as an example, numbers in the range (0-9) occupy a small part of the total ASCII character set. A six-digit number string in base 10 may be represented efficiently as a twenty-digit binary number. Alternatively, the positional relationship of the key strokes to the binary message bits can be maintained if the binary number is encoded using twenty-four binary bits. This is a preferred implementation as the number of bit-errors arising from an incorrect keystroke is limited to four (in this example). It should also be noted that single-digit numbers in base 8 or lower may be encoded using three binary digits or less.

Encoding a binary number with error detection/correction bits is well understood, and typically involves the generation of parity bits. These parity bits may then be converted into ASCII text (or equivalent) and appended to the original message. The advantage of encoding the parity bits as text is that they can be entered using a data entry device (DED), and for purposes of this specification and claims, a DED includes a keyboard, keypad, voice recognition unit, or other human interface. Decoding the parity bits is then straightforward. The appropriate action can then be taken to correct the input automatically and possibly additionally to notify the user of a mistyped key. If automatic correction is not desired, the parity bits could be ignored by the user and flags suppressed subject to software coding for error handling and data entry.

Illustration:

Hamming coding is a well known technique for error correction and is frequently applied to binary data. Further information on Hamming coding is available from, for example, the website at http://www.ee.unb.ca/tervo/ee4253/hamming.htm or the website at http://www2.rad.com/networks/1994/err_con/hamming.htm.

The Hamming rule is expressed by the following inequality: $d+p+1 \leq 2^p$, where d is the number of data bits and p is the number of parity bits. The result of appending the computed parity bits to the data bits is called the Hamming code word. The size of the code word c is obviously d+p, and a Hamming code word is described by the ordered set (c,d). For the case where a six-digit number in base 10 is encoded into twenty-four binary digits, then d=24. If d=24, then 25+p must be less than $2^p$; therefore $p \geq 5$. Five parity bits may be represented by a number in base 10. These parity bits then have a value less than 32 (in base 10). Thus, these bits may be encoded as two alpha or numeric characters—or even as one alphanumeric character in the range (0-9; a-z). Other strings may also be encoded using non-alphanumeric characters (e.g., @-#'/? ... ).

In the example below, one of the numbers in the original character sequence has been entered incorrectly (Table 2) as part of GPS position data in the system 100. Four binary digits are thus incorrect and are subsequently discovered by the parity bits. The example shows parity bits encoded into two characters for illustration. In practice, nine parity bits are needed to correct four bit-errors in such a sequence. This number of parity bits then can be encoded into three characters for transmission and subsequent decoding. The number of parity bits can be varied according to the nature of the character string.

TABLE 1

| | | | | | | | | |
|---|---|---|---|---|---|---|---|---|
| Original Character (Number) Sequence: | 2 | 0 | 5 | 8 | 5 | 6 | | |
| Binary Equivalent with Parity (P) calculated: | 0010 | 0000 | 0101 | 1000 | 0101 | 0110 | +P{1 2 3 4 5 ...} | |
| Binary Encoding with reformatted Parity mapped for keypad entry: | 0010 | 0000 | 0101 | 1000 | 0101 | 0110 | 0011 | 0000 |
| Published characters with Encoding including Reformatted Parity | 2 | 0 | 5 | 8 | 5 | 6 | 3 | 0 |

The published characters are then sent via a transmission channel. We assume for this example that an error occurred in the fourth position during transmission or during receiving operator keyboard/keypad data entry.

TABLE 2

| | | | | | | | | |
|---|---|---|---|---|---|---|---|---|
| Keypad Input with reformatted Parity and error (') introduced into fourth character): | 2 | 0 | 5 | 7' | 5 | 6 | 3 | 0 |
| Binary Decoding showing location of error (') in fourth character location: | 0010 | 0000 | 0101 | 0111' | 0101 | 0110 | 0011 | 0000 |
| Recognized Input error in fourth character corrected using Parity information (Parity discarded): | 2 | 0 | 5 | 8 | 5 | 6 | | |

Thus, it can be seen that the parity data (the seventh and eighth characters entered in the published characters in Table 1 above) is used to automatically correct the error in the fourth character entered in the fifth table above.

It will be understood that a single key stroke typed in error can contain up to 8 bits in error using the entire standard ASCII range. Thus, the code must be capable of detecting potentially large numbers of incorrect bits. The aforementioned method is capable of expansion or contraction depending upon the application. Additionally, fewer parity bits are required to encode numbers in base 8 or lower.

Figure 2:
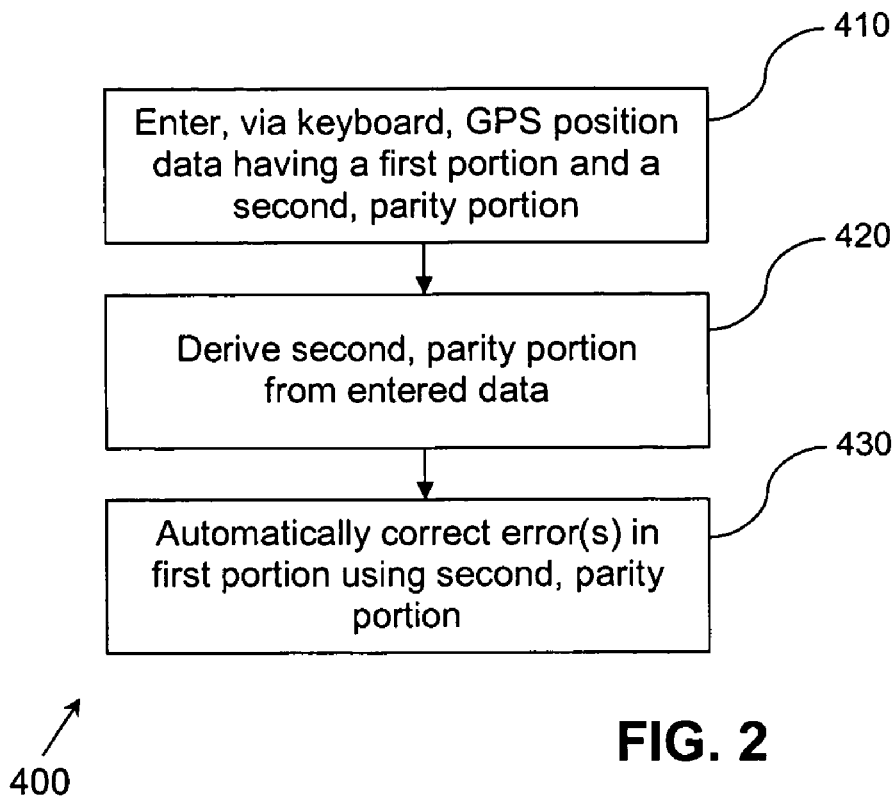
FIG. 2 shows a flow chart illustrating the method used in the system of FIG. 1.

Referring now also to FIG. 2, the method used in the system 100 for automatic correction of operator entry is outlined in the following sequence 400 of steps. In step 410, GPS position data characters (having a first portion and a second, parity portion) are entered by the operator as key presses on the keyboard 200. In step 420, the computer 300 derives the second, parity portion from the entered data. In step 430, the computer 300, using the parity data, automatically corrects error(s) in the first portion of the entered data.

Figure 3:
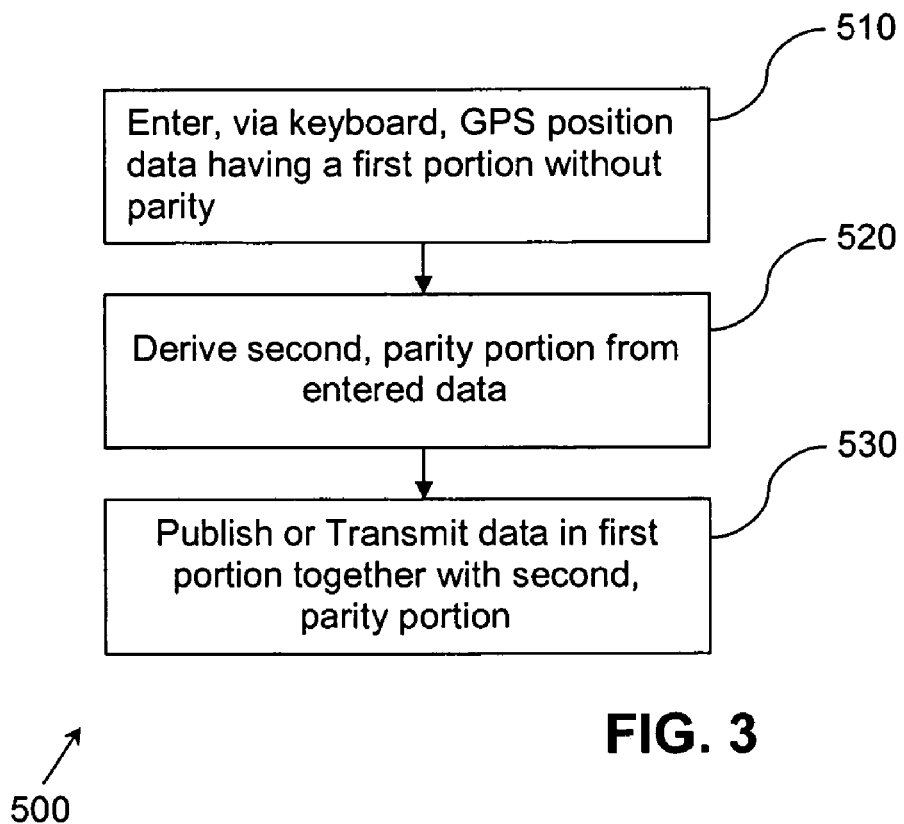
FIG. 3 shows a flow chart illustrating the method used to generate data for use in the system of FIG. 1.

Referring now also to FIG. 3, the method for generation of enhanced GPS position data for subsequent use in the system 100 for automatic correction of operator entry (such as described in the steps 400 above) is outlined in the following sequence 500 of steps. In step 510, an operator enters, via keyboard 200, GPS position data having a first portion without parity. In step 520, the computer 300 derives from the entered data a second, parity portion. In step 530, the data in the first portion, together with the second, parity portion is published (e.g., in printed form) or transmitted to a data store (not shown) for future use.

It will be appreciated that the present invention is not limited to the ASCII character set. It will also be appreciated that the present invention is not restricted to detection/correction of a single keystroke. It will be further appreciated that the parity bits can be inserted at any predefined point in the message. It will be further appreciated that long sequences can be accommodated by splitting the sequence into smaller elements, each smaller elements having its own respective parity bits. It will be further appreciated that sequences with fewer characters than a preset number may be accommodated using padding bits.

Dividing the character string sequence and encoding each character into a predefined number of binary digits is an important part of the method and is necessary for efficient error correction. This sets a limit to the maximum number of incorrect bits received following mistyped key(s).

It will be further appreciated that the present invention is not limited to the Hamming code, and can alternatively utilize other error correction coding techniques. It will be further appreciated that the present invention is not restricted to GPS or navigational aids, and may be applied generally to a man-machine interface requiring data input. In addition, as an alternative to keyboard entry, the information may be transmitted and received reliably using non-electronic means such as voice or other audio, Braille, visual transmission, etc. The use of voice would allow voice recognition as the method of data entry.

The present invention reduces the risk of corruption through the signal channel, but there is always a risk of incorrect (initial) data being encoded. Most of the likely uses will generate the raw data for encoding from either a pre-existing database (e.g., a telephone directory) or automatically through a computer program (e.g., generating map coordinates for a map/navigation system). Such applications are likely to have their own automatic methods for verification. Where manual entry into a database is required, then the environment is usually more controlled and the appropriate level of manual checking might include manual verification by a second party. In less-controlled environments, double-checking by the person performing data entry might be more appropriate.

It will be appreciated that the system and method for automatic correction of data entry by an operator described above may (as mentioned above) be carried out in software running on a processor in the computer, and that the software may be provided as a computer program element carried on any suitable data carrier (not shown) such as a magnetic or optical computer disk.

In summary, it will be understood that the system and method for data entry described above addresses a major source of error at the man-machine interface, providing the following advantages: (a) reduced likelihood of operator entry error, (b) improved end-to-end system reliability, and (c) improved safety in mission-critical situations.

In another embodiment characters may be added onto the original character string to facilitate error detection and error correction i.e. encoding the original character string. The parity bits encoded within the original characters may be converted into ASCII text (or equivalent) and appended to the original character string as additional characters. The advantage of encoding the parity bits as text is that the parity bits can be entered using a standard keyboard or other input device. The encoded original character string is then transmitted across an interface for decoding separately as is shown in FIG. 3.

Illustration:

As previously stated, the Hamming rule is expressed by the following inequality:

$d+p+1 \leq 2^p$, where d is the number of data bits and p is the number of parity bits. The result of appending the computed parity bits to the data bits is called the Hamming code word. The size of the code word c is obviously d+p, and a Hamming code word is described by the ordered set (c,d). For the case where a six-digit number in base 10 is encoded into twenty-four binary digits, then d=24. If d=24, then 25+p must be less than $2^p$; therefore p≧5 for single error correction.

Five parity bits may be represented by a number in base 10. These parity bits then have a value less than 32 (base 10). Thus, these bits may be encoded as two alpha or numeric characters—or even as one alphanumeric character in the range (0-9; a-z). Other strings may also be encoded using non-alphanumeric characters (e.g., @-#'/? . . . ).

Table 3, below, expands on the parity requirements for a six-character string. The number of parity bits is tabulated together with the equivalent number of keypad characters necessary to complete the transmission. It will be seen that an additional five characters need to be appended to provide full single-keystroke (4-bit) protection and automatic recovery.

TABLE 3

|  | Single-Bit Error-Correction (BEC) | Double-Bit Error-Correction (BEC) | Triple-Bit Error-Correction (BEC) | Quad-Bit Error-Correction (BEC) |
| --- | --- | --- | --- | --- |
| Parity Bits Required | 5 bits | 10 bits | 15 bits | 20 bits |
| Encoded Parity Characters for Keypad Input (4 bits per character) | 2 characters | 3 characters | 4 characters | 5 characters |

The parity overhead reduces as the number of bits or characters in the protected string increases. The above example represents a worst-case study for a typical problem.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:

1. A system for data entry, the system comprising:
   means for manual operator entry of data containing a first component and a second component derived from the first component, wherein the second component includes error detection and correction abilities for the first component therefore; and
   means for receiving the entered data, deriving therefrom the second component, and using the second component to detect and correct error in the data received for the first component,
   wherein the means for manual entry includes a data entry device.

2. The system according to claim 1, wherein the means for operator entry of data further comprises voice recognition means enabling the operator to hear the data before entry.

3. The system of claim 1 wherein the second component comprises parity information.

4. The system of claim 3 wherein the second component comprises Hamming code.

5. The system of claim 1 wherein the data comprises GPS position information.

6. The system of claim 1 wherein the second component is arranged to be entered after first component.

7. A method for data entry, comprising the steps of:
   entering, by an operator using a data entry device, of data containing a first component and a second component derived therefrom, wherein the second component has error detection and correction abilities therein; and
   deriving from the entered data the second component and using the second component to detect and correct error in the data entered for the first component.

8. The method according to claim 7, wherein the data entry device is a keyboard.

9. The method of claim 7 wherein the second component comprises parity information.

10. The method of claim 9 wherein the second component comprises Hamming code.

11. The method of claim 7 wherein the data comprises GPS position information.

12. The method of claim 7 wherein the step of entry by an operator of data comprises entry of the first component followed by entry of the second component.

13. The method of claim 7, further comprising the step of deriving, before the step of entering, the second component of data from the first component of the data, wherein the second component has error detection and correction abilities therein.

14. A program storage device readable by a machine, tangibly embodying a program of instructions executable by said machine to perform a method for verifying proper manual data entry into said machine using a data entry device, said method comprising the steps of:
   receiving data containing a first component and a second component derived therefrom, wherein the second component has error detection and correction abilities contained therein; and
   determining from the received data the first component and the second component and using the second component to detect and correct error in the first component.

15. A device according to claim 14, wherein the step of receiving data includes receiving the data from a data entry device.

16. A device according to claim 14, wherein the step of receiving data includes receiving the data from a transmitted signal.

17. A device according to claim 14, wherein the method further includes the step of deriving the second component from the first component.

* * * * *